United States Patent [19]

Henry

[11] Patent Number: 5,583,384
[45] Date of Patent: Dec. 10, 1996

[54] METHOD AND APPARATUS FOR CONNECTING AND DISCONNECTING A POWER FIELD EFFECT TRANSISTOR

[75] Inventor: Paul M. Henry, Tucson, Ariz.

[73] Assignee: National Semiconductor Corporation, Santa Clara, Calif.

[21] Appl. No.: 473,806

[22] Filed: Jun. 7, 1995

[51] Int. Cl.[6] .................................................. H01H 33/59
[52] U.S. Cl. .................. 307/113; 307/112; 327/404; 429/56; 429/99; 257/213; 257/288; 257/328; 257/351; 363/49; 320/51; 320/53; 320/54; 320/59; 361/115
[58] Field of Search .................................. 307/112, 113; 327/404; 257/328, 213, 288, 351; 429/99, 56; 363/49; 320/51, 53, 54, 59, 60; 361/15

[56] References Cited

U.S. PATENT DOCUMENTS

| | | | |
|---|---|---|---|
| 4,532,443 | 7/1985 | Glennon | 327/404 |
| 4,811,065 | 3/1989 | Cogan | 257/328 |
| 5,128,730 | 7/1992 | Coe et al. | 357/23.4 |
| 5,164,889 | 11/1992 | Ruetz | 363/60 |
| 5,193,198 | 3/1993 | Yokouchi | 395/750 |
| 5,216,588 | 6/1993 | Bajwa et al. | 363/60 |
| 5,266,842 | 11/1993 | Park | 307/296.2 |
| 5,268,616 | 12/1993 | Dean et al. | 315/77 |
| 5,280,420 | 1/1994 | Rapp | 363/60 |
| 5,334,914 | 8/1994 | Dean et al. | 315/291 |
| 5,441,518 | 8/1995 | Adams et al. | 607/5 |
| 5,477,130 | 12/1995 | Hashimoto et al. | 320/49 |

*Primary Examiner*—William M. Shoop, Jr.
*Assistant Examiner*—Albert W. Paladini
*Attorney, Agent, or Firm*—Skjerven, Morrill, MacPherson, Franklin & Friel

[57] ABSTRACT

A power switch includes two power FETs connected back-to-back in series at a common source node and a common gate node and a resistor connected between the common source node and the common gate node. The switch further includes a current source and a single-control switch connected to the current source and to the gate node for switching the current source to the gates of the two power FETs.

38 Claims, 3 Drawing Sheets

METHOD AND APPARATUS FOR CONNECTING AND DISCONNECTING A POWER FIELD EFFECT TRANSISTOR

FIELD OF INVENTION

The present invention relates to the field of battery pack circuits. More specifically, this invention relates to switches for controlling conduction and disconnection in a battery pack circuit.

BACKGROUND OF THE INVENTION

A battery pack generally includes a battery, terminals for connecting a battery charger or a lead, a protection circuit for detecting various conditions of the battery such as conditions of potential hazard to the battery, and switches for controlling connection and disconnection of the battery. Typically, a battery pack utilizes a single transistor, generally a field effect transistor (FET), as a switch for controlling connection of the battery. Unfortunately, a single transistor typically conducts some current through an associated body-drain diode so that the battery may not be fully disconnected when disconnection is intended. When the battery is not fully disconnected, unexpected and inappropriate voltages may be applied at the terminals of the battery pack circuit.

Furthermore, the operating potential of a protect circuit is typically only a fraction of the battery voltage. In contrast, a much larger potential difference is applied to a switch for connecting and disconnecting the battery from the pack. This voltage mismatch between the protect circuit and the switch creates a problem. The control signal generated by the protect circuit may be inappropriate for controlling the switch. This problem is exacerbated by the possibility that an illegal charger, a charger having an unsuitable voltage with respect to the battery voltage, may be applied to the battery. For example, a 12 volt charger, or possibly an illegal charger having a voltage greater than 12 volts, may be applied to a battery pack which includes a protect circuit operating at 4 volts. A signal generated by the protect circuit must be suitable for deactivating and activating a FET switch. In this example, a node at which the control signal is applied may be pulled down by the charger, possibly to a −12 volt level with respect to the ground potential of the protect chip. Nevertheless, the control signal must produce a suitable control signal to connect and disconnect the battery by activating and deactivating a FET or a pair of serial FETS.

In addition, battery pack circuits often require an active (logic 1) signal to turn off switches and disconnect the battery. However, this is wasteful of power since it requires an expenditure of power when a load is not connected.

Furthermore, previous battery pack switching approaches require two pins in a control integrated circuit for controlling a switch. Generally, it is advantageous to reduce the number of pins in an integrated circuit since battery pack size is very important for portable applications.

What is required is a switch for controlling battery disconnecting and battery conduction in a battery pack, which is reliably activated and deactivated for connecting and disconnecting the battery despite large voltage mismatches between the switch and the circuit generating a control signal. What is also required is a switch which substantially eliminates current conduction when the battery is disconnected. It is advantageous for such a switch to utilize an active signal to connect, rather than disconnect, the battery. Also, it is important that the control circuit fails safe, that is, in the event of a mechanical disconnect or complete loss of power due to a battery shorting, the FETs would be turned off and left off. This is important for safety.

SUMMARY OF THE INVENTION

In accordance with the present invention, a switch for connecting and disconnecting a battery includes two power FETs connected back-to-back at a common source node in combination with a resistor connecting the common source node to the gates of the power FETs. The switch is controlled by a signal from a protect circuit. Several advantages are gained using the described switch. One advantage is that placement of the resistor between the gates and sources of the FETs provides that the FETs are activated simply by conducting a current to the gates of the FETs. Typically, a P-channel FET drives the control signal to the FETs. The control signal is applied to the switch by conducting a current out of the drain of the P-channel FET and, because the FET is a P-channel device, the voltage at the drain terminal can swing to a large negative potential, advantageously achieving an improved voltage matching between the switch and controller circuits.

In accordance with one embodiment of the present invention, a power switch includes two power field effect transistors (FETs) connected back-to-back in series at a common source node and a common gate node and a resistor connected between the common source node and the common gate node. The switch further includes a current source and a single control switch connected to the current source and to the gate node for switching the current source to the gates of the two power FETs.

In accordance with another embodiment of the present invention, a battery pack includes two power FETs connected back-to-back in series at a common source node and a common gate node, a resistor connected between the common source node and the common gate node and a controller having a single control terminal connected to the common gate node to control the two power FETs.

In accordance with still another embodiment of the present invention, a method of connecting and disconnecting a battery from a circuit includes the steps of connecting two power FETs back-to-back in series at a common source node and a common gate node, connecting a resistor between the common source node and the common gate node and connecting a battery in series with the two power FETs, the power FETs being used to connect and disconnect the battery. The method further includes the step of sourcing a current through the resistor so that a first power FET and a second power FET of the two power FETs are conductive.

One advantage of the power switch described herein is that a control signal at a voltage greatly mismatched from the potential of the switch reliably controls the switch.

Another advantage of the power switch described herein is that the back-to-back connected FETs block current in either direction when the FETs are turned off. In contrast, a single FET would conduct through an inherent body-drain diode in one direction.

Still another advantage of the power switch is that the switch is able to turn on the power switch FETs of the battery pack when a battery charger is connected and the FETs are in the OFF state.

Furthermore, the power switch advantageously shuts off the FETs in a fail-safe operation when power is removed from the circuit. When a control circuit generating the control signal is deactivated so that no current is applied to the power switch, the power FETs of the power switch are deactivated, safely disconnecting the charger from the battery. If, for any reason a fault occurs in a protection chip so that the chip fails to deliver a control signal current, the power FETs are deactivated. In contrast, a conventional power FET switch of the type that is typically used in a battery pack has a gate/source capacitance (Cgs) in the range of several nanofarads, which does not shut off quickly when the control signal to the gate is removed. The fail-safe operation of the switch advantageously avoids an otherwise dangerous condition arising, for example, from application of an unsuitable charger to the battery.

An additional advantage is that, when the battery is disconnected, no power is expended to deactivate the FETs. Thus the amount of self-discharge of a battery pack that is disconnected from a battery is reduced, a highly desirable characteristic for a battery pack held in storage.

A further additional advantage is that a single pin furnishes the control signal for connecting and disconnecting a battery. Previous conventional approaches utilize two pins for receiving control signals.

Additionally, the power switch advantageously uses an active signal to activate the FETs and thereby connect the battery to the battery pack. Conventional switches typically utilize an active signal to turn off the FETs and disconnect the battery pack. Usage of an active signal to activate the FETs advantageously conserves power since power is expended to actuate the switch when the load is connected and therefore, the load is consuming energy and the power used to drive the switch is comparatively insignificant.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION

Figure 1:
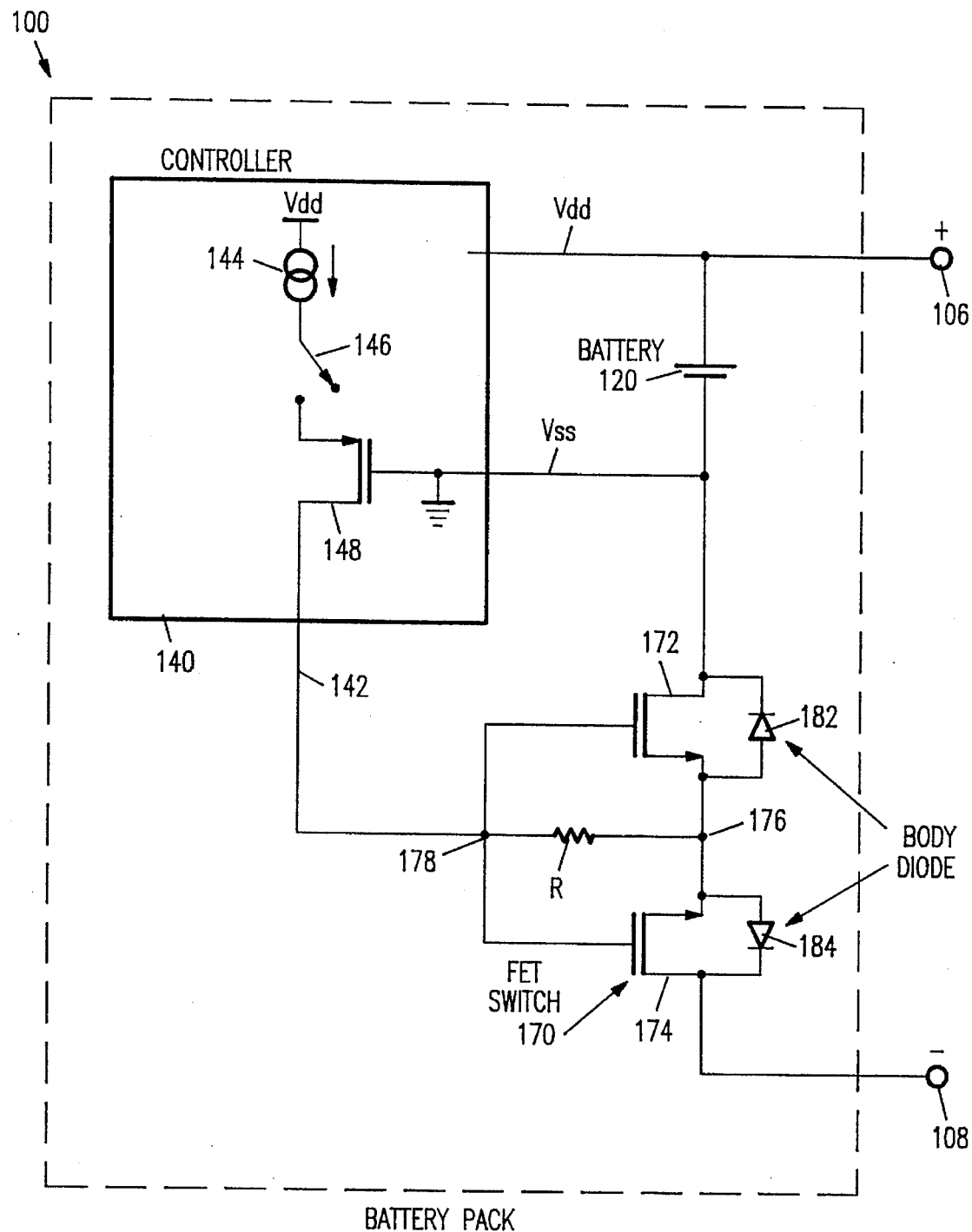
FIG. 1 is a schematic diagram which illustrates a mixed circuit and block structures of a battery pack in accordance with an embodiment of the present invention.

Referring to FIG. 1, a battery pack 100 includes a battery 120, a controller 140 and a power switch 170. A plus terminal 106 and a minus terminal 108 supply an interface for connecting a battery charger (not shown).

In some embodiments, the battery 120 is a single cell. In other embodiments, the battery 120 takes the form of multiple serial or parallel cells. The battery 120 is connected between a supply terminal VDD and a ground reference terminal VSS. The supply terminal VDD is connected to the plus terminal 106 of the battery pack 100.

The controller 140 controls the state of charge of the battery 120 and generates signals for protecting from overcharging and over-discharging of a battery 120 which includes a single battery cell or multiple battery cells, either serial and parallel, in a battery stack (not shown). The controller 140 controls battery measurements and, from these measurements, determines the polarity of the current entering the battery during charging or exiting the battery upon application of a load. The controller 140 also determines the condition of charge of the battery, whether the battery is overcharged or over-discharged. The controller 140 also determines the condition of charging of the battery, whether the current charging the battery is too large. If the battery 120 is overcharged or over-discharged, or if the charging current is too great, the controller 140 disconnects the battery 120 by applying a control signal to power MOSFETs 172 and 174 of the power switch 170. The controller 140 controls the ON/OFF state of the power switch 170, which is connected in series with the battery 120. The controller 140 includes a current source 144, a switch 146 and a P-channel MOSFET 148. The switch 146 controls application of current from the current source 144 to the source of P-channel MOSFET 148. The P-channel MOSFET 148 is a high voltage P-channel device having a drain which is connected to a control terminal 142 which is further connected to the power switch 170 to supply a single pin (not shown) on the controller 140 integrated circuit (not shown). It is generally advantageous to minimize the number of pins on an integrated circuit chip. The gate of MOSFET 148 is connected to the ground reference terminal VSS.

In other embodiments, the controller 140 may utilize a different type of transistor in place of the P-channel MOSFET 148. For example, a bipolar PNP transistor or a standard-voltage FET may be used.

Figure 3:
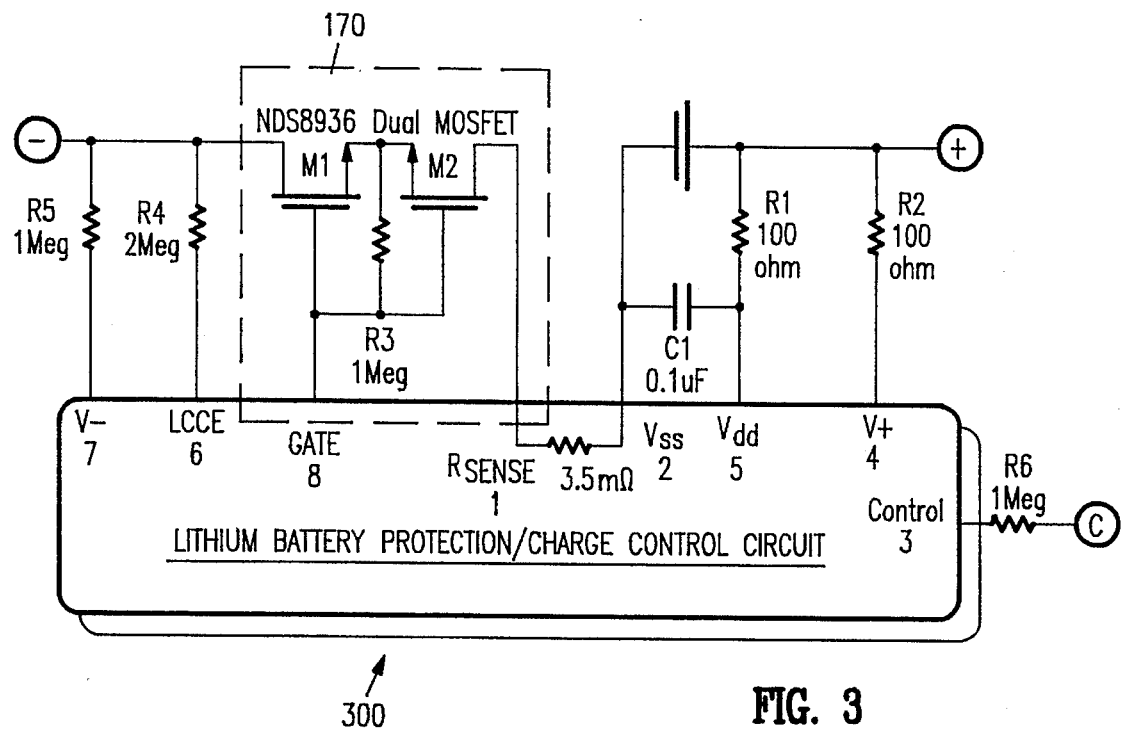
FIG. 3 is a mixed circuit and block schematic diagram of a controller for usage in the battery pack shown in FIG. 1.

In one embodiment, the controller 140 is a protection / charger control integrated circuit (IC) 300 for a 3.6 V lithium-ion battery pack, which is shown in FIG. 3. Although the illustrative embodiment shows a battery pack 100 for application to lithium ion batteries, the described circuits are also applicable to other battery chemistries. The protection / charger control IC 300 controls four states of charging and automatically disconnects a battery when a battery cell is over-charged or under-charged. The protection / charger control IC 300 measures the cell voltage of the battery, compares the measured cell voltage to maximum and minimum limits and determines a state of charging according to the measuring cell voltage. The protection / charger control IC 300 monitors the bidirectional current flow in the battery pack by measuring the voltage across a current-sensing resistor $R_{cs}$ internal to the IC 300 and detects appropriate battery pack conditions for recovery from a fault condition. The IC 300 turns off the power switch 170 when a fault limit is exceeded. The IC 300 ignores momentary surge faults. When the control IC 300 turns off the power switch 170 in response to detection of an over-discharged battery cell, the IC 300 monitors the potential across the power switch 170 to detect the presence of a battery charger. If a charger has been applied, the control IC 300 activates the power switch 170. In the case of an overcharged cell, the control IC 300 monitors the potential across the power switch 170 to detect whether a load has been applied to the battery pack 100 and, if so, the control IC 300 activates the power switch 170. The four states of battery charging, which vary in applied charging voltage and duty cycle, allow slow charging for deeply discharged cells and for cells that are nearly fully charged and allow charging to begin even for cell voltages as low as 0 V.

Referring again to FIG. 1, the power switch 170 is connected in series with the battery 120 to effect disconnect and conduction of the battery 120. The power switch 170 protects the battery 120 from inadvertent electrical overstress and safely controls charging of the battery 120. The power switch 170 includes two power N-channel MOSFETs 172 and 174 which are connected back-to-back in series with the sources of MOSFETs 172 and 174 connected at a common source node 176 and the gates of MOSFETs 172 and 174 connected a common gate node 178. The power N-channel MOSFETs 172 and 174 are used to disconnect the battery 120 and place the battery 120 in a conduction state. When the back-to-back connected MOSFETs 172 and 174 are deactivated or turned off, the MOSFETs 172 and 174 advantageously block conduction of current in either direction. The power switch 170 also includes a resistor R which is connected between the common source node 176 and the common gate node 178. The resistor is a relatively large resistor having a resistance in a range from approximately 0.5MΩ to 20MΩ. The resistor R is a high-value external resistor, for example having a resistance of 1mΩ, so that a 4 µA current creates a 4 volt signal which is more than sufficient to activate the MOSFETs 172 and 174.

Two body-drain diodes 182 and 184 are formed across the source/drain pathways of the two power N-channel MOSFETs 172 and 174, respectively. The body-drain diodes 182 and 184 are conductive in a direction from source to drain of respective power N-channel MOSFETs 172 and 174. The drain of MOSFET 172 is connected to the ground reference terminal VSS. The drain of MOSFET 174 is connected to the minus terminal 108 of the battery pack 100. The common gate node 178 is connected to the control terminal 142 of the controller 140 to receive a control current for controlling the state of the power switch 170.

The power switch 170 elements, in combination, are implemented to achieve several objectives. In particular, the common-source and common-gate back-to-back interconnection of the power N-channel MOSFETs 172 and 174 completely blocks current in either direction to fully disconnect the battery 120. In addition, a current generated by the controller 140 is conducted through the resistor R, establishing a voltage across the gate-source terminals of the two power N-channel MOSFETs 172 and 174 and causing the MOSFETs 172 and 174 to become conductive, closing the power switch 170 and connecting the battery 120. These events occur even when the source voltage of the MOSFETs 172 and 174 is below the ground voltage on the ground reference terminal VSS, even for voltage deficiencies in the range of several volts. Furthermore, these events occur although a substrate layer of the controller 140 integrated circuit is at ground potential. The conditions of: (1) a source voltage of MOSFETs 172 and 174 that is substantially below the ground potential and (2) a ground potential of the controller 140 integrated circuit substrate, occur when a battery charger is connected to the battery pack 100 while the MOSFETs 172 and 174 are initially turned off (nonconducting). Accordingly, the power switch 170 can turn on the power switch MOSFET transistors 172 and 174 of the battery pack 100 when the battery charger is connected and the MOSFETs 172 and 174 are deactivated.

The resistor R also facilitates deactivation of the power N-channel MOSFETs 172 and 174 by removing charge that is applied to the gates if the power N-channel MOSFETs 172 and 174. As current is conducted through the resistor R, the gate-source voltage $V_{gs}$ of the power N-channel MOSFETs 172 and 174 collapses, causing the MOSFETs 172 and 174 to turn off or deactivate. As the MOSFETs 172 and 174 are deactivated, the battery 120 is disconnected. Thus, the MOSFETs 172 and 174 are turned off when the battery 120 is disconnected so that no power is expended keeping the MOSFETs 172 and 174 inactive.

In the event of failure of a controller 140 integrated circuit or short-circuiting of the battery 120, current is removed to the resistor R and the power N-channel MOSFETs 172 and 174 are deactivated. In this manner, the battery pack 100 circuit fails safely.

Figure 2:
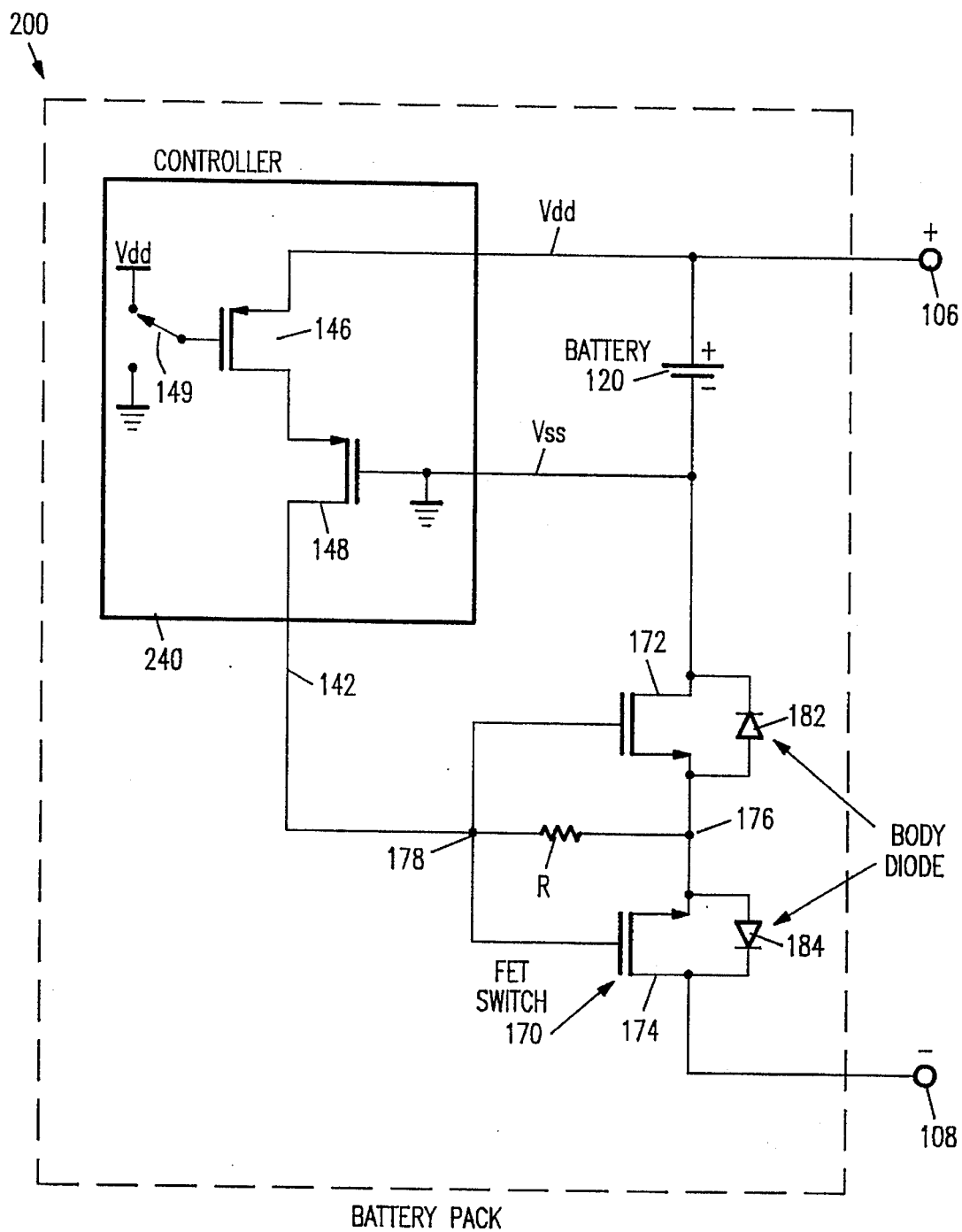
FIG. 2 is a schematic diagram which illustrates a mixed circuit and block structures of a battery pack in accordance with another embodiment of the present invention.

Referring to FIG. 2, an alternative embodiment of a battery pack 200 includes the battery 120, a controller 240 and the power switch 170. In comparison to the battery pack 100 and controller 140 shown in FIG. 1, battery pack 200 includes a controller 240 in which current source 144 is replaced by direct connection to supply terminal VDD. In some embodiments, the switch 146 is a P-channel FET. When the gate of the P-channel FET (switch 146) is pulled low, MOSFET 148 is turned on so that, in effect, the MOSFET 148 switch is closed, raising the voltage of the control terminal 142 to the voltage of the power supply terminal VDD (less the voltage drop of the FETs 146 and 148).

Figure 4:
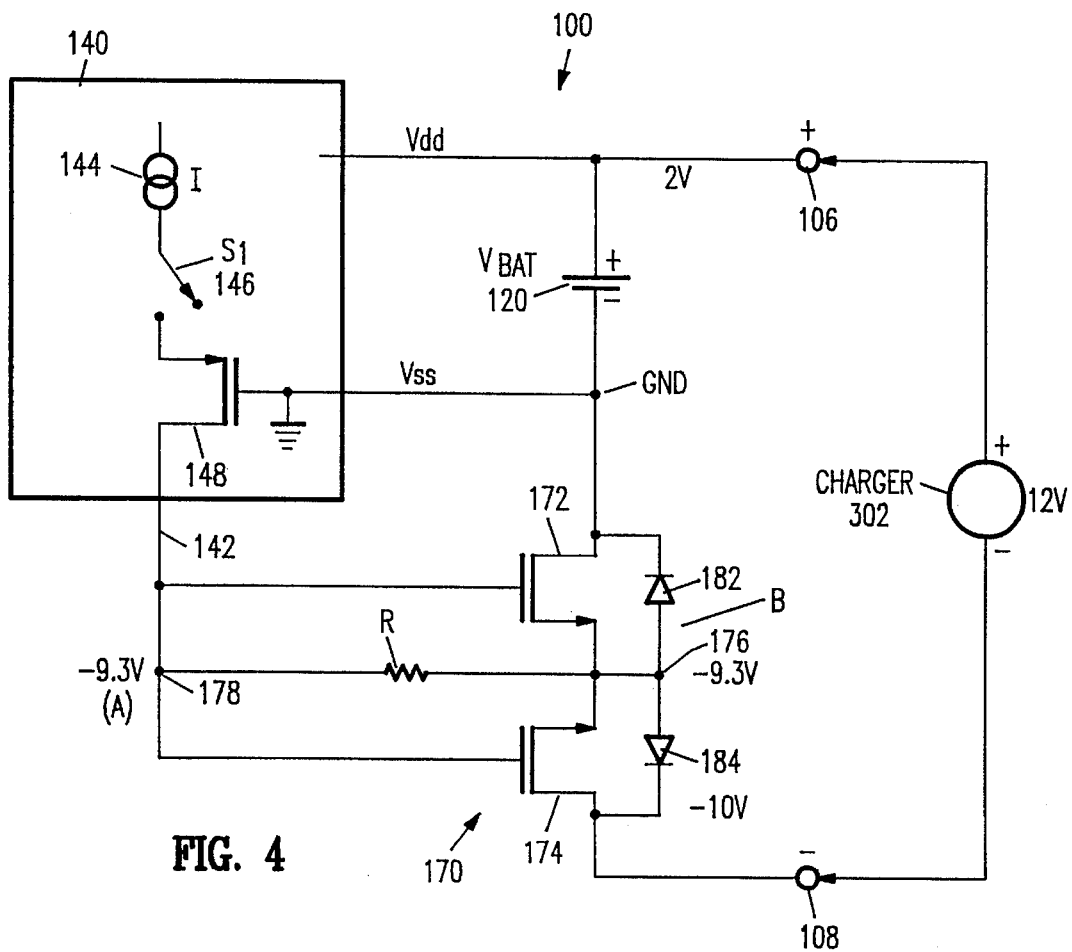
FIG. 4 illustrates a mixed circuit and block schematic diagram of a battery pack shown in FIG. 1 including voltage conditions when the battery pack is connected to a battery charger.

Operation of the battery pack 100 is described with respect to the schematic diagram shown in FIG. 4. A current source 144 internal to the controller 140 is selectively connected to the P-channel MOSFET 148 under control of the switch 146. Under conditions in which the controller 140 determines that the power switch 170 is to connect the battery 120 to a load (not shown) or a charger 302, the switch 146 connects the current source 144 to control terminal 142 at common gate node 178 and current is conducted out of the controller 140 even though the voltage at the control terminal 142 also numbered 178 is a large negative potential relative to the ground reference potential of the controller 140. This current is applied to the gates of N-channel MOSFETs 172 and 174 activating the power switch 170 and connecting the charger 302 or a load (not shown) to the battery 120.

In one example of the operation of the battery pack 100, the battery pack 100 is connected to a 12 volt battery charger 302. In this example, the battery 120 supplies a nominal potential of 2 volts (in a discharged state) in a range between 1.8 volts and 4.4 volts. The 12 volt battery charger 302 is connected to the battery pack 100 and the power N-channel MOSFETs 172 and 174 are open, rather than conducting. When the power N-channel MOSFETs 172 and 174 are turned off, the voltage on the common source node 176 is −9.3 volts with respect to ground potential on ground reference terminal VSS. The battery 120 is disconnected. The substrate (not shown) of the controller 140 integrated circuit is also at the ground potential. Power N-channel MOSFETs 172 and 174 are deactivated when switch 146 of the controller 140 suspends conduction of current through resistor R, which causes the gate to source voltage $V_{gs}$ of power N-channel MOSFETs 172 and 174 to be at zero potential.

To connect the battery 120, switch 146 of the controller 140 is closed, conducting current through MOSFET 148 and resistor R. As current is applied to resistor R, the source-gate voltage $V_{gs}$ increases so that the power N-channel MOSFETs 172 and 174 are turned on.

Accordingly, a current path between the controller 140 and the power switch 170 is controlled as the power switch 170 uses two power control FETs connected back-to-back, such as power N-channel MOSFETs 172 and 174, and a resistor R connected from a common source node 176 between the FETs to the gates of the FETs. The resistor R connected between the gates and the sources of the two power N-channel MOSFETs 172 and 174 and the current source 144 creates a voltage across resistor R which turns on the FETs. When switch 146 is controlled to interrupt the flow of current or when the current is otherwise discontinued, for example in a failure condition, the voltage drop at the resistor R collapses, turning off the power N-channel MOSFETs 172 and 174.

Notably, when a charger 302 is connected to the battery pack 100, sources of the MOSFETs 172 and 174 can be 10 to 12 volts below ground. This voltage is below the voltage level of the integrated circuit chip substrate (not shown). The described power switch circuit 170, in combination with the controller 140, drives the node 178 which swings to a voltage level far below the ground reference potential of the controller 140.

The description of certain embodiments of this invention is intended to be illustrative and not limiting. Numerous other embodiments will be apparent to those skilled in the art, all of which are included within the broad scope of this invention. The apparatus and method according to this invention are not confined to lithium-ion battery packs, and can be used in many other applications such as nickel-cadmium and nickel-metal hydride battery packs, for example.

What is claimed is:

1. A power switch comprising:

two power FETs coupled back-to-back in series at a common source node and a common gate node;

a resistor coupled between the common source node and the common gate node; and a FET coupled to the two power FETs and coupled to the resistor.

2. A switch according to claim 1 wherein the two power FETs include:

a first N-channel MOSFET having a source terminal coupled to a first end of the resistor, a drain terminal and a gate terminal coupled to the second end of the resistor; and a second N-channel MOSFET having a source terminal coupled to the source terminal of the first N-channel MOSFET and coupled to the first end of the resistor, a drain terminal and a gate terminal coupled to the gate terminal of the first N-channel MOSFET and to the second end of the resistor.

3. A switch according to claim 2 further comprising:

a high voltage P-channel MOSFET having a source terminal and having a drain terminal coupled to the gate terminals of the first and second N-channel MOSFETs and coupled to the second end of the resistor.

4. A switch according to claim 3 further comprising:

a current source;

a switch coupling the current source to the source terminal of the high voltage P-channel MOSFET.

5. A switch according to claim 1 further comprising:

two diodes respectively coupled across the source/drain pathways of the two power FETs, the diodes being conductive from source to drain of respective power FETs.

6. A switch according to claim 5 wherein the diodes are body-drain diodes.

7. A switch according to claim 1 further comprising:

a battery coupled in series with the two power FETs, the power FETs being used to connect and disconnect the battery.

8. A switch according to claim 7 further comprising:

a first terminal at a first end of the series-connected battery and power FETs; and a second terminal at a second end of the series-connected battery and power FETs, the first and second terminals for connecting a positive terminal and a negative terminal of a battery charger.

9. A switch according to claim 1 further comprising:

a current source; and a control switch coupled to the current source and to the gate node for switching the current source to the gates of the two power FETs.

10. A switch according to claim 1 wherein the resistor is a relatively large resistor having a resistance in a range from approximately 100KΩ to 20MΩ.

11. A battery pack comprising:

two power FETs coupled back-to-back in series at a common source node and a common gate node;

a resistor coupled between the common source node and the common gate node; and a controller having a control terminal coupled to the common gate node to control the two power FETs.

12. A battery pack according to claim 11 wherein the controller further comprises:

a transistor coupled to the two power FETs at the common gate node;

an electrical source; and a switch coupling the electrical source to the transistor.

13. A battery pack according to claim 11 wherein the controller further comprises:

a FET coupled to the two power FETs at the common gate node;

a current source; and a switch coupling the current source to the FET.

14. A battery pack according to claim 11 wherein the two power FETs include:

a first N-channel MOSFET having a source terminal coupled to a first end of the resistor, a drain terminal and a gate terminal coupled to the second end of the resistor; and a second N-channel MOSFET having a source terminal coupled to the source terminal of the first N-channel MOSFET and coupled to the first end of the resistor, a drain terminal and a gate terminal coupled to the gate terminal of the first N-channel MOSFET and to the second end of the resistor.

15. A battery pack according to claim 14 wherein the controller further comprises:

a high voltage FET coupled to the two power FETs at the common gate node, the high voltage FET including:

a high voltage P-channel MOSFET having a source terminal and having a drain terminal coupled to the gate terminals of the first and second N-channel MOSFETs and coupled to the second end of the resistor;

a current source; and a switch coupling the current source to the high voltage FET.

16. A battery pack according to claim 11 further comprising:

two diodes respectively coupled across the source/drain pathways of the two power FETs, the diodes being conductive from source to drain of respective power FETs.

17. A battery pack according to claim 16 wherein the diodes are body-drain diodes.

18. A battery pack according to claim 11 further comprising:

a battery coupled in series with the two power FETs, the power FETs being used to connect and disconnect the battery.

19. A battery pack according to claim 18 further comprising:

a first terminal at a first end of the coupled battery and power FETs; and a second terminal at a second end of the series-connected battery and power FETs, the first and second terminals for connecting a positive terminal and a negative terminal of a battery charger.

20. A battery pack according to claim 11 wherein the controller further comprises:

a current source; and a control switch coupled to the current source and to the gate node for switching the current source to the gates of the two power FETs.

21. A battery pack according to claim 11 wherein the resistor is a relatively large resistor having a resistance in a range from approximately 0.1MΩ to 20MΩ.

22. A method of connecting and disconnecting a battery from a circuit comprising the steps of:

coupling two power FETs back-to-back in series at a common source node and a common gate node;

coupling a resistor between the common source node and the common gate node; and coupling a battery in series with the two power FETs, the power FETs being used to connect and disconnect the battery.

23. A method according to claim 22, further comprising the step of:

sourcing a current through the resistor so that a first power FET and a second power FET of the two power FETs are conductive.

24. A method according to claim 23, further comprising the step of:

removing the current through the resistor so that the first power FET and the second power FET of the two power FETs are nonconductive.

25. A method according to claim 22, further comprising the step of:

connecting a battery charger in parallel with the series-connected battery and power FETs.

26. A method according to claim 25, further comprising the step of:

sourcing a current through the resistor so that a first power FET and a second power FET of the two power FETs are conductive.

27. A method according to claim 26, further comprising the step of:

removing the current through the resistor so that the first power FET and the second power FET of the two power FETs are nonconductive.

28. A power switch comprising:

two power FETs coupled back-to-back in series including a first power FET having a source terminal and a gate terminal and a second power FET having a source terminal directly coupled to the source terminal of the first power FET at a common source node and a gate terminal directly coupled to the gate terminal of the first power FET at a common gate node; and a resistor coupled between the common source node and the common gate node.

29. A switch according to claim 28 further comprising:

a FET coupled to the two power FETs and coupled to the resistor.

30. A switch according to claim 28 wherein the two power FETs include:

a first N-channel MOSFET having a source terminal coupled to a first end of the resistor, a drain terminal and a gate terminal coupled to the second end of the resistor; and a second N-channel MOSFET having a source terminal coupled to the source terminal of the first N-channel MOSFET and coupled to the first end of the resistor, a drain terminal and a gate terminal coupled to the gate terminal of the first N-channel MOSFET and to the second end of the resistor.

31. A switch according to claim 30 further comprising:

a high voltage P-channel MOSFET having a source terminal and having a drain terminal coupled to the gate terminals of the first and second N-channel MOSFETs and coupled to the second end of the resistor.

32. A switch according to claim 3 further comprising:

a current source;

a switch coupling the current source to the source terminal of the high voltage P-channel MOSFET.

33. A switch according to claim 28 further comprising:

two diodes respectively coupled across the source/drain pathways of the two power FETs, the diodes being conductive from source to drain of respective power FETs.

34. A switch according to claim 33 wherein the diodes are body-drain diodes.

35. A switch according to claim 28 further comprising:

a battery coupled in series with the two power FETs, the power FETs being used to connect and disconnect the battery.

36. A switch according to claim 35 further comprising:

a first terminal at a first end of the series-connected battery and power FETs; and a second terminal at a second end of the series-connected battery and power FETs, the first and second terminals for connecting a positive terminal and a negative terminal of a battery charger.

37. A switch according to claim 28 further comprising:

a current source; and a control switch coupled to the current source and to the gate node for switching the current source to the gates of the two power FETs.

38. A switch according to claim 28 wherein the resistor is a relatively large resistor having a resistance in a range from approximately 100KΩ to 20MΩ.

\* \* \* \* \*